United States Patent
Ehm et al.

(10) Patent No.: US 8,477,285 B2
(45) Date of Patent: Jul. 2, 2013

(54) PARTICLE CLEANING OF OPTICAL ELEMENTS FOR MICROLITHOGRAPHY

(75) Inventors: Dirk Heinrich Ehm, Lauchheim (DE); Arnoldus Jan Storm, Delft (NL); Johannes Hubertus Josephina Moors, Helmond (NL); Almut Czap, Aalen (DE); Mona Nagel, Aalen (DE); Jacques Cor Johan van der Donck, Alpen aan den Rijn (NL); Jetske Karina Stortelder, den Haag (NL); Marijn Sandtke, Delfgauw (NL); Maria Isabel Catalina Caballero, Den Haag (NL); Luigi Scaccabarozzi, Valkenswaard (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 269 days.

(21) Appl. No.: 12/973,844

(22) Filed: Dec. 20, 2010

(65) Prior Publication Data

US 2011/0188011 A1 Aug. 4, 2011

Related U.S. Application Data

(63) Continuation of application No. PCT/EP2009/001581, filed on Mar. 6, 2009.

(60) Provisional application No. 61/073,918, filed on Jun. 19, 2008.

(30) Foreign Application Priority Data

Jun. 19, 2008 (DE) .......................... 10 2008 028 868

(51) Int. Cl.
G03B 27/52 (2006.01)
G03B 27/42 (2006.01)

(52) U.S. Cl.
USPC ............................................. 355/30; 355/53

(58) Field of Classification Search
USPC ................. 355/30, 53; 250/492.2, 492.22
See application file for complete search history.

(56) References Cited

U.S. PATENT DOCUMENTS

| 6,253,464 B1 | 7/2001 | Klebanoff et al. |
| 6,395,102 B1 | 5/2002 | Salamati-Saradh et al. |

(Continued)

FOREIGN PATENT DOCUMENTS

| DE | 101 09 242 C1 | 6/2002 |
| EP | 1 329 773 A2 | 7/2003 |

(Continued)

OTHER PUBLICATIONS

Office action of the Japanese Patent Office dated Jun. 7, 2011 issued in the parallel Japanese patent application No. 2011-513892 and an English translation thereof.

(Continued)

Primary Examiner — Hung Henry Nguyen
(74) Attorney, Agent, or Firm — Walter Ottesen, P.A.

(57) ABSTRACT

An optical assembly is mounted in a projection exposure apparatus (101) for EUV microlithography and includes at least one vacuum chamber (70, 71, 68a), at least one optical element (6, 7; 65, 66; 63) arranged in the vacuum chamber (70, 71, 68a), the optical element (6, 7; 65, 66; 63) having an optical surface (18) arranged to be impinged upon by a useful beam bundle (3) of the projection exposure apparatus (101), and a cleaning device (72) configured to clean the optical surface (18). The cleaning device (72) is configured to perform particle cleaning of the optical surface (18) at a gas pressure within the vacuum chamber (70, 71, 68a) which is higher than a vacuum pressure ($p_o$) for performing an exposure operation with the projection exposure apparatus (101). As a result, optical elements having respective optical surfaces arranged to be impinged upon by a useful beam bundle can be cleaned reliably of foreign particles.

25 Claims, 8 Drawing Sheets

U.S. PATENT DOCUMENTS

| | | |
|---|---|---|
| 6,964,485 B2 | 11/2005 | Singer et al. |
| 7,015,489 B2 | 3/2006 | Singer et al. |
| 7,030,959 B2 | 4/2006 | Sogard |
| 7,244,954 B2 | 7/2007 | Singer et al. |
| 7,323,698 B2 | 1/2008 | Sogard |
| 7,362,414 B2 | 4/2008 | Singer et al. |
| 7,367,138 B2 | 5/2008 | Sogard |
| 7,495,239 B2 * | 2/2009 | Freriks et al. .............. 250/492.2 |
| 7,671,965 B2 * | 3/2010 | Banine et al. ................... 355/53 |
| 2002/0051124 A1 | 5/2002 | Banine et al. |
| 2003/0051739 A1 | 3/2003 | Klebanoff et al. |
| 2004/0011381 A1 | 1/2004 | Klebanoff et al. |
| 2004/0061930 A1 | 4/2004 | Wedowski |
| 2005/0058836 A1 | 3/2005 | Goldstein |
| 2005/0223718 A1 | 10/2005 | Sogard |
| 2005/0275835 A1 | 12/2005 | Sogard |
| 2006/0001958 A1 | 1/2006 | Hasegawa |
| 2006/0115771 A1 | 6/2006 | Wilhelmus Van Herpen et al. |
| 2007/0079525 A1 | 4/2007 | Sogard |
| 2007/0132989 A1 | 6/2007 | Kaller et al. |
| 2007/0145296 A1 | 6/2007 | Freriks et al. |
| 2007/0146657 A1 * | 6/2007 | Mierlo et al. ................... 355/30 |
| 2008/0083885 A1 | 4/2008 | Wilhelmus Van Herpen et al. |
| 2008/0184584 A1 | 8/2008 | Sogard |
| 2008/0218712 A1 | 9/2008 | Compen et al. |

FOREIGN PATENT DOCUMENTS

| | | |
|---|---|---|
| JP | 2006-120774 A | 5/2006 |
| JP | 2007-157981 A | 6/2007 |
| WO | 2004/104707 A2 | 12/2004 |
| WO | 2008/007952 A2 | 1/2008 |
| WO | 2008/034582 A2 | 3/2008 |
| WO | 2009/059614 A1 | 5/2009 |

OTHER PUBLICATIONS

Lammers, N.A. et al, "Laser Shockwave Cleaning of EUV Reticles", Photomask Technology 2007, pp. 67304P-1 to 67304P-12, Proc. of SPIE, vol. 6730, 67304P (2007).

International Search Report dated Jul. 22, 2009 of international application PCT/EP 2009/001581 on which this application is based.

International Preliminary Report on Patentability dated Dec. 21, 2010 of international application PCT/EP2009/001581 on which this application is based.

* cited by examiner

PARTICLE CLEANING OF OPTICAL ELEMENTS FOR MICROLITHOGRAPHY

CROSS-REFERENCE TO RELATED APPLICATIONS

This is a Continuation of International Application PCT/EP2009/001581, with an international filing date of Mar. 6, 2009, which was published under PCT Article 21(2) in English, which claims priority under 35 U.S.C. §119(a) to German Patent Application No. 10 2008 028 868.3, filed on Jun. 19, 2008, and the entire contents of which are hereby incorporated by reference; this application also claims the benefit under 35 U.S.C. 119(e)(1) of U.S. Provisional Application No. 61/073,918, filed on Jun. 19, 2008, the entire contents of which are also hereby incorporated by reference.

FIELD OF THE INVENTION

The present invention relates to an optical assembly mounted in a projection exposure apparatus for microlithography, in particular for EUV lithography. Further, the invention relates to illumination optics as well as to projection optics for such a projection exposure apparatus. Furthermore, the invention relates to a projection exposure apparatus of this kind having an optical assembly of this kind, a method for cleaning an optical element to be mounted in a projection exposure apparatus of this kind as well as a method for manufacturing a micro- or nano-structured component.

BACKGROUND OF THE INVENTION

Foreign particles on optical surfaces of optical elements (typically mirrors and reticles) for EUV lithography mainly cause uniformity and contrast problems in an EUV lithography apparatus. Besides, there is also a considerable risk that a particle may be transferred to the reticle and/or the waver level where a one to one imaging of the particle may occur. Therefore, there is a need for cleaning foreign particles away from the optical surfaces before integration of the EUV optics in a EUV lithography apparatus or, more preferably, after the integration of the EUV optics inside the EUV lithography apparatus.

United States patent application publication 2009/0231707 discloses an EUV lithography apparatus comprising a device for generating a temperature gradient between the optical surface and the surface of an adsorbent material surrounding the optical surface. The heating of the optical surface, respectively the cooling of the adsorbent surface leads to a reduction of the occupation of contaminating particles on the optical surface, as the temperature gradient induces a movement of the particles from the optical surface to the adsorbent material, also known as thermophoretic effect.

US 2008/0218712 A1 discloses an immersion lithographic apparatus which includes a cleaning system for in-situ cleaning of a component of the lithographic apparatus. The cleaning system is arranged to provide a cleaning environment in proximity of a predetermined position on a component to be cleaned. The system is also arranged to provide the cleaning environment substantially independent of a type of contamination present at the predetermined position.

EP 1 329 773 A2 discloses a lithographic apparatus in which, in a low-pressure environment, a voltage is applied between a tool tip in close proximity to a surface and that surface, and contaminants are attracted and adhere to the tool. A laser may also be used for in-situ cleaning of components of a lithographic projection apparatus.

WO 2004/104707 A2 describes a method for cleaning at least one optical component in an EUV lithography apparatus, the optical component being at least partially soiled with an inorganic substance. At least one reagent which chemically reacts with the soiling deposits is added through a supply system to remove them from the optical component.

US 2007/0132989 A1 discloses an examination system for locating contamination on an optical element. The examination system and the optical element may both be arranged at the interior of the same vacuum chamber, thus allowing in-situ inspection of the optical element without the vacuum in the chamber having to be released.

US 2003/0051739 A1 describes an optical assembly to be mounted in a projection exposure apparatus for EUV microlithography having a mirror and a cleaning a device. US 2004/0011381 A1 discloses a method for removing carbon contamination from optical surfaces using atomic hydrogen.

OBJECTS OF THE INVENTION

One object of the present invention is to provide optical elements having optical surfaces which may be impinged upon by a useful beam bundle, which surfaces can be cleaned with great reliability from foreign particles. Another object of the present invention is to specify a cleaning method for an optical element, which optical element can be cleaned with great reliability from foreign particles.

SUMMARY OF THE INVENTION

According to a first aspect, the invention is realized in an optical assembly mounted in a projection exposure apparatus for EUV lithography, comprising: at least one vacuum chamber, at least one optical element arranged in the vacuum chamber, the optical element having an optical surface which may be impinged upon by a useful beam bundle of the projection exposure apparatus, and a cleaning device arranged to clean the optical surface, wherein the cleaning device is configured to perform particle cleaning of the optical surface at a gas pressure within the vacuum chamber which is higher than a vacuum pressure for performing an exposure operation with the projection exposure apparatus. The vacuum pressure for performing the exposure operation is typically about $10^{-1}$ to $10^{-9}$ mbar, depending of whether or not a purge gas is used.

According to the first aspect of the invention, it is proposed to perform particle cleaning of the optical surfaces of optical elements arranged in the EUV lithography apparatus just after the optics integration or maintenance, respectively, but before the pump down of the EUV lithography apparatus for starting the exposure operation has been finished. In this way, the problems of particle cleaning, e.g. enhanced EUV light absorption, thermal effects, inhomogenities, etc., which are caused when vacuum pressure in the EUV lithography apparatus is attained can be disposed with. In particular, when performing the particle cleaning at higher pressures, it is possible to use cleaning methods which do not require the particles to undergo a chemical reaction with the cleaning agent for removing them from the optical surface, such that when bringing the cleaning agent into contact with the optical surface, damaging of the optical surface due to a reaction of the cleaning agent with the optical surface may be prevented.

In one embodiment, during the particle cleaning, the gas pressure in the vacuum chamber is above 10-9 mbar, preferably above 10-3 mbar, in particular above 0.1 mbr. The person skilled in the art will appreciate that it is possible to perform at least part of the particle cleaning while pumping down the lithography apparatus. In this case, however, the overall pressure in the vacuum chamber should not be smaller than the above-described values in order to keep the particle cleaning efficient.

In a further embodiment, the optical assembly comprises a particle monitoring device for monitoring the particle coverage on the optical surface. Particle monitoring can be used for detecting particles on the optical surface, thus allowing a dedicated cleaning in regions of the optical surface where a large concentration of particles is detected. Moreover, the particle monitoring allows estimating the cleaning time required to remove foreign particles from the optical surface. In particular, for performing the monitoring, an examination device may be employed as described in US 2007/0132989 A1, the entire contents of which are hereby incorporated by reference.

In one development, the optical assembly further comprises a control device for controlling the cleaning of the particle cleaning device in dependence of the particle coverage monitored by the particle monitoring device, preferably in a feedback loop. Using the control device, it is possible to perform the monitoring in a first step, and based upon the result of the monitoring, to set the appropriate parameters for the subsequent cleaning step, it being possible to use a feedback loop by performing a repetition of the monitoring and cleaning steps until the desired cleaning result is achieved. Of course, it is also possible to perform the monitoring and cleaning simultaneously, in particular when the cleaning is performed in a targeted manner. Alternatively, in case that an entirely non-destructive cleaning method is used, the feedback loop and possibly the monitoring device may be dispensed with, as in this case, the time duration of the cleaning may be known beforehand, e.g. set to a pre-determined value which may exceed the cleaning time which is actually needed for entirely removing the particles from the optical surface.

In a further embodiment, the particle cleaning device comprises at least one cleaning head which is directed to the optical surface of the optical element. The cleaning head may be static, in this case typically being directed to the center of the optical surface, or alternatively, a movement mechanism may be provided for moving, e.g. tilting or translating, the cleaning head relative to the optical surface, as is detailed in PCT/EP2007/009593 by the applicant, the entire contents of which are hereby incorporated by reference.

In one embodiment, the particle cleaning device is configured to perform the particle cleaning by at least one cleaning method selected from the group consisting of: snow cleaning, in particular using carbon dioxide ($CO_2$), argon (Ar), or nitrogen ($N_2$), laser shockwave cleaning, air knife cleaning, magnetic field cleaning, high voltage cleaning, plasma assisted cleaning, temperature assisted cleaning, and the use of an adhesion foil or a polymeric peel-off layer. Snow cleaning, in particular using carbon dioxide, has been proven to be a particularly useful method for performing particle cleaning on optical surfaces. However, an overall pressure above vacuum pressure, in particular ambient pressure, is required for performing snow cleaning. Another method for removing particles from optical surfaces is laser shockwave cleaning, which has been proven to remove particles of a size of 500 nm and below from the surface of EUV reticles and wafers, cf. e.g. the article "Laser shockwave cleaning of EUV reticles" by N. A. Lammers et al., Photomask Technology, 2007. Edited by Naber, Robert J.; Kawahira, Hiroichi. Proceedings of the SPIE, Volume 6730, pp. 67304P (2007), the entire contents of which are incorporated herein by reference. In air wave cleaning, clean, high-velocity air is used to sweep surfaces clear without damaging the surface finish, see e.g. U.S. Pat. No. 6,395,102, the entire contents of which are incorporated herein by reference. Magnetic field cleaning and high voltage cleaning are further cleaning methods which allow liberating particles from optical components using electrical, magnetic or electromagnetic fields, as exemplified in EP 1 329 773 A2. In the context of the present invention, however, the electric/magnetic fields are applied at a much higher pressure The above techniques may advantageously be combined with the generation of a plasma, in particular when performing laser shockwave cleaning, see e.g. US 2008/0218712 A1, the entire contents of which are incorporated herein by reference. Also in this respect, the plasma produced by the EUV light source may be advantageously used for the purpose of laser shockwave cleaning. Also, a temperature gradient may be applied between the optical surface and the environment, as is explained in detail in WO 2008/034582 A2 by the applicant, the entire contents of which are incorporated herein by reference. Of course, it is also possible to perform contact cleaning on the optical surface, in particular by bringing an adhesive foil or another suitable adhesive material into contact with the optical surface.

In a further embodiment, the particle monitoring device comprises at least one monitoring head directed to the optical surface of the optical element.

As is the case with the cleaning head, the monitoring head may also be static or connected to a movement mechanism for performing the monitoring in a targeted manner.

In another embodiment, the particle monitoring device is configured to perform the particle monitoring by at least one monitoring method selected from the group consisting of: light scattering methods, holographic methods, thermal differential imaging methods, and optical or electron optical methods. For performing these methods, it may be required to install an additional light source in the EUV lithography apparatus which emits radiation to the optical surface, possibly in a directed way. Using real-time holographic interferometry, a particle fall-out monitor may be realized. Such an Automated Particle Fall-out Monitor technique allows for a holographic reconstruction of defects and particles on a relatively smooth surface. If the surface is illuminated with a laser beam, the scattered light interferes with the reflected light. When these two beams are coherent, optical interference between the reference beam (reflected light) and the object beam (particle scattered light) produces a series of intensity fringes, due to the superposition of the light waves, these can be recorded on standard CCD camera. This way, a hologram can be created. This image can be brought in focus by a computer algorithm using simple scattering theory, after which, standard recognition software will detect the particles. Thermal imaging methods, in particular thermal differential imaging, may also be used to detect the particle coverage on the optical surface.

In yet another embodiment, the vacuum chamber further comprises a particle trapping device for trapping particles having been cleaned away from the optical surface, the particle trapping device preferably comprising at least one of a cold trap and an electrostatic or an electro-magnetic trap.

The trapping of the particles may be maintained also during the operation of the lithography system under vacuum conditions, the particles being released only when the vacuum is switched off again, e.g. during maintenance of the lithography system. It will be understood that alternatively or in addition, the particles may be removed from the vacuum chamber by using a pumping device, in particular comprising an inlet in the vicinity of the optical surface.

In a further embodiment, at least part of the walls of the vacuum chamber comprises a material which adsorbs particles having been cleaned away from the optical surface. The adsorbing material at the inside of the walls of the vacuum chamber may be a catalytic material, preferably rhodium, palladium, molybdenum, iridium, osmium, rhenium, silver, zinc oxide or their alloys, in particular ruthenium. It will be understood that these or other adsorbent materials may also be used in a particle trap which is arranged inside the vacuum chamber.

A further aspect of the invention is implemented in an optical assembly mounted in a projection exposure apparatus for microlithography, comprising:
  at least one optical element having an optical surface which may be impinged upon by a useful beam bundle of the projection exposure apparatus,
  a deposition device arranged to deposit a carbon containing layer onto the optical surface,
  a cleaning device arranged to clean the optical surface.

An assembly of this kind offers the opportunity to provide the optical surface to be cleaned with a carbon containing layer prior to the cleaning as required. Cleaning is facilitated due to such a carbon containing layer since carbon containing gases may be formed upon the impingement of a cleaning medium in a targeted manner, which assist in detaching the foreign particles depositions on the optical surface to be cleaned. This results in improved cleaning performance of the optical surface as compared to the cleaning of an optical surface which does not have a carbon containing layer prior to cleaning.

The cleaning device may be configured for cleaning the optical surface with a cleaning agent, e.g. with atomic hydrogen. This cleaning medium has proved to be particularly efficient, in particular in connection with the cleaning of optical elements in the form of mirrors having coatings which improve the mirrors' reflectance. Mirrors of this kind may be, in particular, mirrors reflecting EUV radiation, wherein the reflectivity increasing coating may be accomplished as a multilayer coating.

The assembly may comprise a vacuum pump for sucking off gases and/or debris from the optical surface. The cleaning performance is enhanced by a vacuum pump of this type.

The assembly may comprise a pressure sensor for detecting a gas pressure in a vacuum chamber accommodating the optical element. A pressure sensor of this kind is enabling control of the probability of whether a contamination of the optical elements with foreign particles must be expected, such that appropriately timed counter-measures may be taken. Alternatively or additionally, the optical assembly may have a contamination sensor for detecting a contamination of the optical surface of the optical element. The presence, in particular, of a carbon containing layer on the optical surface is deemed to be contamination.

The pressure sensor or the contamination sensor may be in signal communication with a controller of the deposition device. A configuration of this kind enables an automatic switching on of the deposition device under the provision that a contamination of the optical element with foreign particles has to be expected due to the presence of a corresponding gas pressure value detected by the pressure sensor or due to the presence of a measured contamination value.

The assembly may have at least one access opening to the vacuum chamber, which is lockable by a door. A door signal device may be provided then which is configured to provide a door signal depending on the present position of the door. A door signal device of this kind enables an automatic switching-on, in particular, of the deposition device once an opening of the door or preparations to open a door, e.g., activation of a trap, and thus an imminent contamination of the optical elements arranged in the vacuum chamber with foreign particles are detected. A valve may be provided as well instead of a door. This being the case, a valve signal device is provided instead of a door signal device configured to provide a valve signal depending on the present position of the valve.

The assembly according to the invention may be part of illumination optics and/or part of projection optics and part of a projection exposure apparatus with a radiation source for generating a useful beam bundle, illumination optics for illuminating an object field in an object plane and projection optics for imaging of the object field on an image field in an image plane. In illumination optics of this kind, projection optics of this kind and projection exposure apparatus of this kind the advantages of the optical assembly according to the invention are brought to bear. The assembly according to the invention may also be part of collector optics initially collecting the radiation generated by the radiation source prior to entry into the illumination optics. Then collector optics or a collector unit may be part of the projection exposure apparatus as well.

Another aspect of the invention is implemented in a method for cleaning an optical surface of an optical element arranged in a vacuum chamber of a projection exposure apparatus for EUV lithography, the method comprising: performing particle cleaning of the optical surface at a gas pressure within the vacuum chamber which is higher than a vacuum pressure attained when performing an exposure operation with the projection exposure apparatus. By performing the particle cleaning directly after the optics integration and maintenance, respectively, and before attaining a vacuum pressure in the EUV lithography apparatus, cleaning methods may be employed which do not require the cleaning agent to undergo a chemical reaction with the contaminating particles, thus avoiding damaging of the optical surface when the latter is brought into contact with the cleaning agent.

During the vacuum cleaning, the gas pressure in the vacuum chamber may be chosen to be above $10^{-9}$ mbar, preferably above $10^{-3}$ mbar, in particular above 0.1 mbar. Also, the particle cleaning may be performed by at least one particle cleaning method chosen from the group consisting of: snow cleaning, in particular using carbon dioxide ($CO_2$), argon (Ar), or nitrogen ($N_2$), laser shockwave cleaning, air knife cleaning, magnetic field cleaning, high voltage cleaning, plasma assisted cleaning, temperature assisted cleaning, and the use of an adhesion foil or a polymeric peel-off layer. The method may further comprise monitoring the particle coverage on the optical surface, the particle cleaning preferably being controlled in dependence of the particle coverage thus detected, in particular using a feedback loop. Moreover, the particle monitoring may be performed by at least one monitoring method selected from the group consisting of: light scattering methods, holographic methods, and thermal differential imaging methods, and optical or electron optical methods. The particles which have been cleaned away from the optical surface may be at least one of pumped off from the vacuum chamber and trapped, in particular adsorbed, inside of the vacuum chamber.

The advantages of these cleaning methods correspond to the advantages having been discussed with reference to the optical assembly.

A further aspect of the invention is implemented in a method for cleaning an optical element comprising:
  providing an optical element having a carbon containing layer on an optical surface of the optical element,
  cleaning the optical element.

During or after the cleaning which, in particular, may be done by using a cleaning agent, e.g. atomic hydrogen, a vacuum chamber accommodating the optical element may be pumped off. Alternatively or additionally to such pumping off, flushing a chamber which accommodates the optical element may be made using a flushing gas. Prior to the cleaning a carbon containing layer may be deposited onto the optical layer of the optical element in a targeted manner. Due to this cleaning friendliness of the optical element is systematically achieved. Deposition of the carbon containing layer may be made in dependence of a gas pressure value or a contamination value being measured in a vacuum chamber accommodating the optical element. The contamination value may be measured directly on the optical element as well, in particular, directly on the optical surface of the optical element. Deposition may be made as soon as it is detected that a vacuum chamber accommodating the optical element is open. In general, deposition of the carbon containing layer may also be made during the operation of the projection exposure apparatus or, accordingly, during the operation of the optics being used there.

The advantages of these cleaning methods correspond to the above-mentioned advantages which were discussed already with reference to the optical assembly according to the invention.

Due to the deposition prior to a door being opened on the vacuum chamber, cleaning friendliness of the optical elements which due to the door being opened are contamination-prone is achieved systematically. Deposition of a carbon containing layer may be made in general prior to performing the particle generating processes. Such particle generating processes are comprised, e.g. of work performed on the wafer, in particular, exchange of the wafer, performing work on the reticle, in particular, exchange of the reticle, or moving the components influencing the guidance of the useful beam, e.g. movement of a diaphragm of the useful beam.

Deposition of the carbon containing layer may be made prior to an exchange of the EUV radiation source of the projection exposure apparatus. When the EUV radiation source is changed a prolonged downtime of the projection exposure apparatus has to be expected on the one hand and a contamination of at least those optical elements on the other hand which are adjacent to the radiation source and/or accommodated in the same vacuum chamber. In general, the carbon containing layer may be deposited in the course of maintenance activities being performed on the projection exposure apparatus, if the evacuated chambers accommodating optical elements of the projection exposure apparatus need to be opened because of these maintenance activities.

A method for manufacturing structured components may comprise:
  providing a wafer onto which a layer of light sensitive material is at least partially deposited,
  providing a reticle having structures to be imaged,
  providing a projection exposure apparatus according to the invention,
  projecting at least part of the reticle onto a region of the layer of the wafer with the aid of the projection exposure apparatus.

The advantages of this method of manufacturing correspond to the above-mentioned advantages discussed in connection with the optical assembly according to the invention and the cleaning method according to the invention.

Further features and advantages of the invention can be extracted from the following description of embodiments of the invention, with reference to the figures of the drawing which show inventive details, and from the claims. The individual features can be realized individually or collectively in arbitrary combination in a variant of the invention.

BRIEF DESCRIPTION OF THE DRAWINGS

Embodiments of the invention will be explained in detail with reference to the drawing.

DETAILED DESCRIPTION OF PREFERRED EMBODIMENTS

Figure 1:
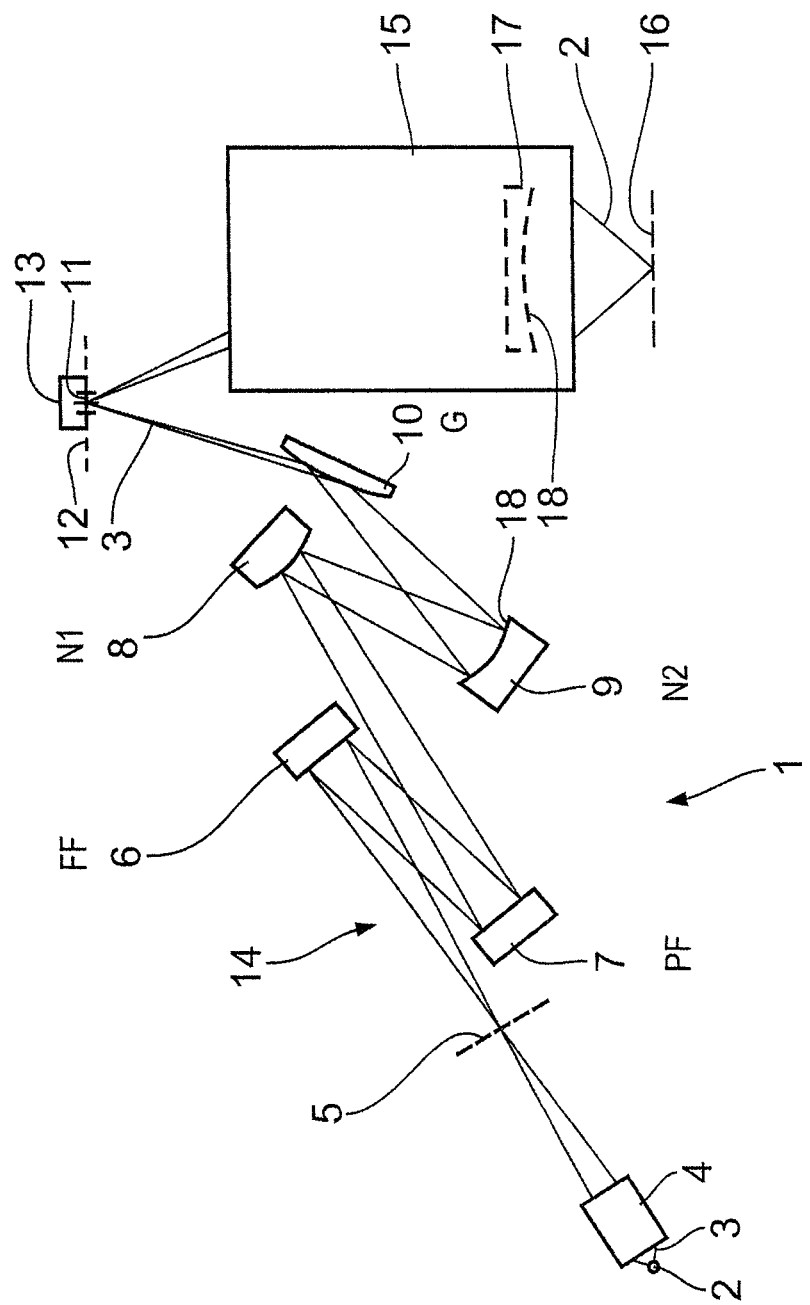
FIG. 1 shows a diagram of a projection exposure apparatus for EUV microlithography, with an illumination optics being represented in a meridional section.

FIG. 1 shows the schematic representation of a projection exposure apparatus 1 for EUV microlithography. The projection exposure apparatus 1 has an EUV radiation source 2 for generating a useful beam bundle 3. In particular, the wavelength of the useful beam bundle 3 is between 5 nm and 30 nm. The EUV radiation source 2 may be an LLP source (laser-produced plasma) or a GDPP source (gas discharge-produced plasma). Alternatively, e.g. a DUV radiation source may be used as well for generating for example a useful beam bundle having a wavelength of 193 nm.

The useful beam bundle 3 is collected by a collector 4. Pertinent collectors are known, e.g., from EP 1 225 481 A and US 2003/0043455 A. Downstream of collector 4 the useful beam bundle 3 initially propagates through an intermediate focal plane 5 and then impinges onto a field-faceted mirror 6. Upon reflection from the field-faceted mirror 6 the useful beam bundle 3 impinges upon a pupil-faceted mirror 7.

Upon reflection from pupil-faceted mirror 7 the useful bundle 3 is initially reflected from two other mirrors 8, 9. Mirror 8 which is directly downstream of pupil-faceted mirror 7 is designated mirror N1 as well hereinafter. Mirror 9 which is downstream of mirror N1 is also designated mirror N2 hereinafter. Downstream of mirror N2 the useful beam bundle 3 impinges upon a grazing incidence mirror 10. Said mirror 10 is designated mirror G hereinafter.

In conjunction with pupil-faceted mirror 7 the further mirrors 8 to 10 image faceted fields of field-faceted mirror 6 onto an object field 11 in an object plane 12 of projection exposure apparatus 1. A surface section of a reflecting reticle 13 to be imaged is arranged in object field 11.

Mirrors 6 to 10 and, in a broader sense, collector 4 as well belong to illumination optics 14 of projection exposure apparatus 1.

Projection optics 15 image object field 11 onto an image field (not shown in FIG. 1) in an image plane 16. Pupil-faceted mirror 7 lies in an optical plane which is optically conjugated to a pupil plane of projection optics 15.

Object field 11 is curved, with the meridional section of illumination optics 14 represented in FIG. 1 running through a mirror symmetry axis of object field 11. A typical extension of object field 11 in the drawing plane of FIG. 1 is 8 mm. Perpendicular to the drawing plane of FIG. 1 a typical extension of object field 11 is 104 mm. A rectangular object field, e.g. with a corresponding aspect ratio of 8 mm×104 mm is also possible.

Projection optics 15 is a mirror optics. A final mirror 17 of the projection optics 15 which is designated mirror M6 hereinbelow is represented in dashed lines in FIG. 1. Upstream of this mirror M6 five other mirrors M1 to M5 (not shown in FIG. 1) are arranged in projection optics 15.

Figure 2:
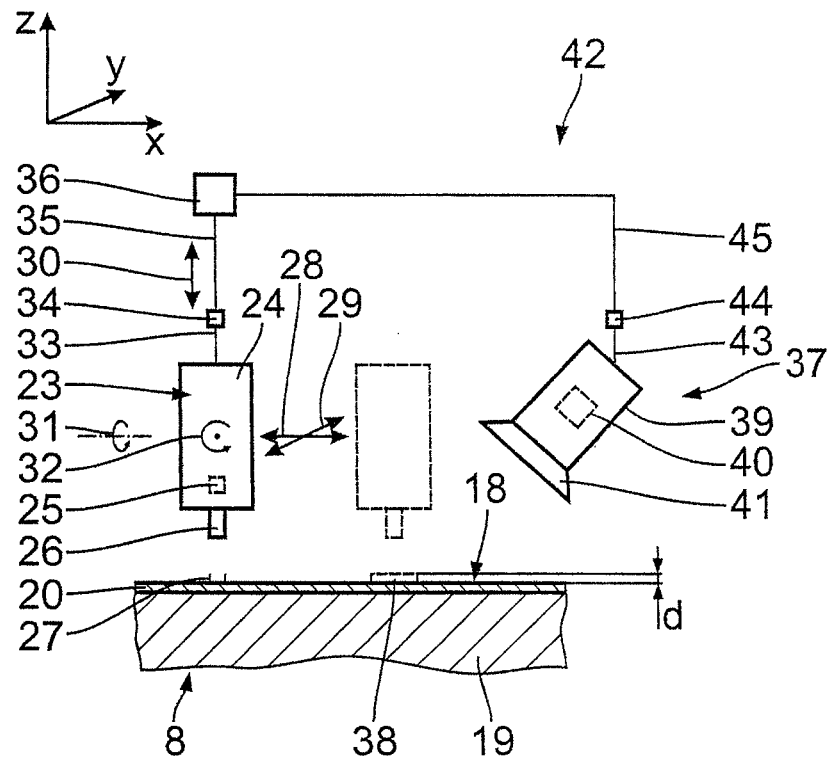
FIG. 2 shows a schematic cut-out view through a cross-section of a mirror serving as an optical element to be mounted in a projection exposure apparatus according to FIG. 1, having a cleaning device for cleaning an optical surface of the mirror in two operating positions and a deposition device for depositing a surface layer onto the optical surface in an idle position.

Any one of mirrors 6 to 10 of illumination optics 14 and M1 to M6 of projection optics 15 constitutes an optical element having an optical surface 18 onto which a useful beam bundle 3 may impinge (cf. FIG. 2). Reticle 13 as well constitutes an optical element of this type.

To facilitate the description of relative positions a local xyz cartesian coordinate system relative to the respective optical surface 18 is shown in the below figures. In FIG. 2, the x-axis runs to the right. The y-axis is represented in a perspective projection in FIG. 2 and runs, per se, vertical to the drawing plane of FIG. 2. The z-axis runs bottom-up in FIG. 2. The respective region of optical surface 18 under consideration, which of course may also be curved, is in the x-y-plane.

The example of mirror N1, viz. mirror 8, depicted in FIG. 2, shows a variety of devices for cleaning optical surface 18 and for intermittent deposition of a carbon containing surface layer onto optical surface 18 as a preparatory measure prior to cleaning. The embodiments provided hereinafter which are explained in connection with these devices by using mirror 8 as an example will apply mutatis mutandis to respective devices which may be provided on the other mirrors 6 to 10 plus M1 to M6 of projection exposure apparatus 1 plus on reticle 13 as well. Devices of this kind for cleaning an optical surface and for intermittent deposition of a carbon containing surface layer onto the surface as a preparatory measure prior to cleaning may also be assigned to collector 4, in particular at least to a collector mirror of said collector 4. This may be done in particular in connection with the use of an LPP source as EUV radiation source 2.

The representation in FIG. 2 is a cut-out of optical surface 18 with an associated base body 19 of mirror 8. The optical surface 18 has a reflective coating 20 which is supported by base body 19.

Figure 5:
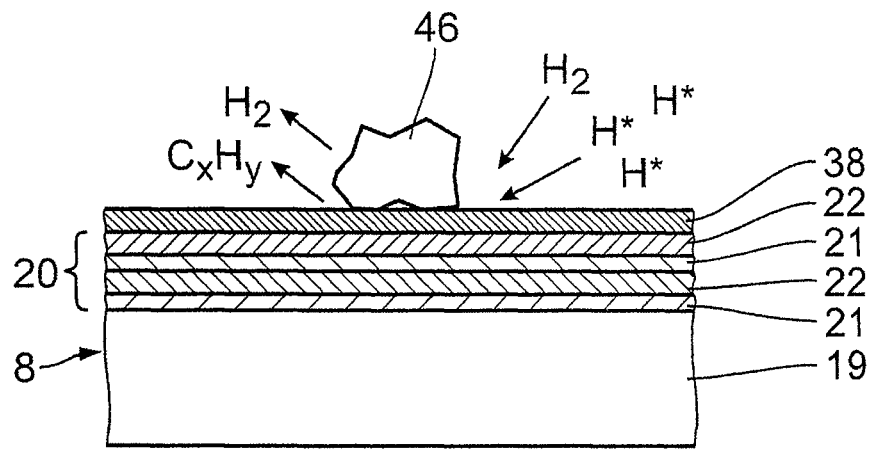
FIG. 5 shows a close-up view of a foreign particle on a carbon containing layer of a multilayer reflection coating of a mirror in a representation of a mirror cross-section which is closed-up compared to FIGS. 2 to 4.
Figure 6:
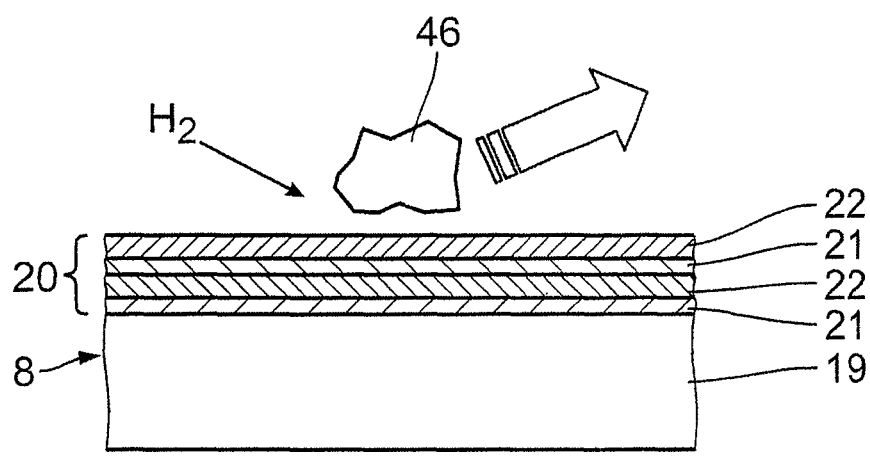
FIG. 6 shows the conditions prevailing upon removing particles with the aid of atomic hydrogen being used for cleaning in a representation similar to FIG. 5.

FIGS. 5 and 6 disclose details of the reflective coating 20. Reflective coating 20 is a multilayer coating with plural, e.g. a plurality of several tens to several hundreds of alternating successive bilayers of two layers 21, 22 each, comprised of different materials. One of the two layer materials may be molybdenum. The other layer material may be silicon. FIGS. 5 and 6 exemplarily show four alternating successive layers 21, 22, i.e. two bilayers. As a matter of fact the number of successive layers may be higher. The reflective coating 20 is optimized concerning the wavelength of useful beam bundle 3 plus its angle of incidence onto the optical surface 18.

First of all, a cleaning device 23 for cleaning an optical surface 18 is assigned to mirror 8. In FIG. 2, cleaning device 23 is shown in a solid line in a first operating position and in a dashed line in a second operating position that is displaced relative to the first operating position. A housing 24 of cleaning device 23 accommodates a source for generating a cleaning gas. This source, e.g. for hydrogen radicals, is indicated at 25 in housing 24 of FIG. 2 as a dashed line. The source 25 may be configured according to the principles of US 2003/0051739 A1, which reference is incorporated into the present application by reference. In the example of FIG. 2 the cleaning gas is comprised of hydrogen radicals. Other cleaning gases, such as discussed, e.g., in US 2003/0051739 A, may be employed as well. The cleaning gas is fed from cleaning device 23 via a nozzle 26 to the optical surface 18. A local section 27 of optical surface 18 is impinged upon by the cleaning gas from said nozzle, the schematic limitations of which section are schematically indicated in a direction x in a sectional view of FIG. 2. The surface of the local section 27 is pre-determined in dependence of the configuration of nozzle 26 and the distance z of nozzle 26 from the optical surface 18. The typical surface of local section 27 is 1 mm×1 mm.

The nozzle 26 constitutes a cleaning gas inlet device towards optical surface 18. According to the configuration of cleaning device 23 according to FIG. 2, nozzle 26 is aligned perpendicular to optical surface 18. Alternatively, nozzle 26 may be aligned to the optical surface 18 with a different angle such that the cleaning gas slantingly impinges on optical surface 18.

The cleaning device 23 may be displaced in direction x (double arrow 28), may be displaced in direction y (double arrow 29) and may be displaced in direction z (double arrow 30). Further, the cleaning device 23 may be tilted around or pivoted about the x-axis (directional arrow 31) and tilted around the y-axis (directional arrow 32). If the nozzle 26 comprising a beam cross-section for the cleaning gas having non-rotational symmetry to the z-axis, the cleaning device 23 may be pivoted about its longitudinal axis as well, viz., the z-axis.

Cleaning device 23 is in signal communication with a controller 34 via a signal line 33. The control of the motion of cleaning device 23 about the translational and tilting or pivoting degrees of freedom mentioned above is accomplished via controller 34. Further, the source 25 plus a locking element (not shown) of nozzle 26 are driven via controller 34.

Via a signal line 35a local controller 34 is in signal communication with a central controller 36 of projection exposure apparatus 1.

Figure 4:
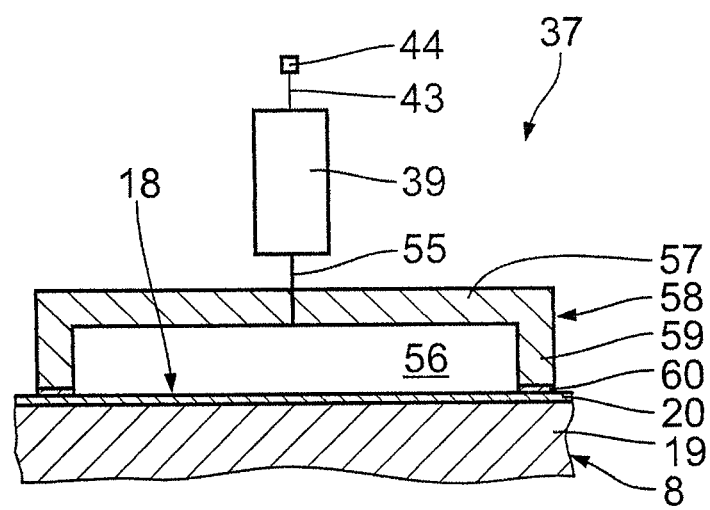
FIG. 4 shows the mirror cut-out in a further embodiment of the deposition device in a representation similar to FIG. 3.

In addition, a deposition device 37 is assigned to mirror 8 for an at least intermittent deposition onto the reflection coating 20 of optical surface 18 of a carbon containing surface layer 38 having layer thickness d. In FIGS. 2 and 4, this surface layer 38 is indicated in a dashed line locally and is also shown largely magnified in FIG. 5.

A housing 39 of deposition device 37 encompasses a source 40 of hydrocarbon containing gas indicated in a dashed line, e.g. for a gas having $C_nH_{2n+2}$ as one component. In particular, source 40 may be a deposition gas source, e.g. the gas comprising nonane $C_9H_{18}$ or another alkane, e.g. methane $CH_4$. Hydrocarbons containing fluoride or hydrocarbons comprising benzene groups may be employed as well as deposition gas. The gases containing hydrocarbons may be substituted hydrocarbons as well, viz. those incorporating functional groups. Gases containing salt or gases containing metal hydride may be employed as well as deposition gases. Housing 39 of deposition device 37 is rigidly aligned relative to the base body 19 of mirror 8. The entire optical surface 18 of mirror 8 may be impinged upon by deposition gas from an opened-out inlet piece 41 of deposition device 37. Optical surface 18 is slantingly impinged upon by the deposition gas.

In the projection exposure apparatus 1 each mirror 6 to 10 plus M1 to M6 has a cleaning device 23 each and a deposition device 37 each, being configured as per the description given hereinabove. Together with the respective mirror 6 to 10 plus M1 to M6 the associated cleaning device 23 and the associated deposition device 37 form an optical assembly 42. Reticle 13 as well may be part of an optical assembly 42 of this kind. Other variants of projection exposure apparatus 1 in accordance with the invention have mirrors with an optical assembly 42 of this kind, others have mirrors without said optical assembly 42. At least one optical assembly 42 of this kind is provided in each of these variants of projection exposure apparatus.

Deposition device 37 is in communication with a local controller 44 via a signal line 43. Said controller controls source 40 and a locking element (not shown) between source 40 and inlet 41. The local controller 44 is in communication with the central controller 36 via yet another signal line 45.

Hereinafter a cleaning method for an optical surface 18 of mirror 8 is described. In the process mirror 8 is initially provided on the optical surface 18 with a carbon containing layer. This carbon containing layer is either present per se or provided by deposition on the reflective coating 20 or is, under the provision that mirror 8 is in a cleaned condition, in which reflective coating 20 is free from a carbon containing layer arranged thereon, deposited using deposition device 37 onto the reflective coating 20 in a targeted manner. For this purpose the local controller 44 of the deposition device 37 is driven by the central controller 36 such that the deposition gas impinges upon optical surface 18 via the source 40 and the feeder 41, such that on the entire optical surface 18 the surface layer 38 is formed having the defined thickness d. Ideally, surface layer 38 as it is configured, is a closed monolayer comprised of the material of surface layer 38.

In this situation foreign particles 46 may adhere in a non-permanent fashion on optical surface 18 as may be gathered clearly from FIGS. 5 and 6. As shown in FIG. 5, particle 46 is not deposited directly on the reflective coating 20, but on top of carbon containing layer 38. Now, using cleaning device 23, cleaning gas may be deposited onto the local section 27 on which particle 46 is provided. In the cleaning gas free hydrogen radicals (H*) plus hydrogen atoms (H$_2$) are provided. The free hydrogen radicals compound with the carbon of surface layer 38 to form gaseous hydrocarbons C$_x$H$_y$. The carbon atoms of surface layer 38 via which particle 46 is adhering to mirror 8 are also used to form gaseous hydrocarbons. Thereby particle 46 becomes detached from the mirror 8 (cf. FIG. 6) and may be blown away from the optical surface 18 with the aid of cleaning device 23 or may be pumped off with the aid of a vacuum pump (not shown), as it is made clear in FIG. 6 by directional arrow 47.

Instead of impinging cleaning gas in a targeted manner onto optical surfaces of individual mirrors for a selective local cleaning, cleaning of one of the mirrors may be accomplished locally as described hereinafter. For this purpose a mask 49 is arranged between cleaning device 23 and the optical surface 18. FIGS. 7 to 10 show magnified embodiments of masks 49 of this kind. Each of these masks 49 has a central breakthrough with an inner boundary in a uniform carrier 50 which is square in one exemplary embodiment. The carrier 50 is held above the optical surface 18 by a holding device (not shown in the drawing).

Figure 7:
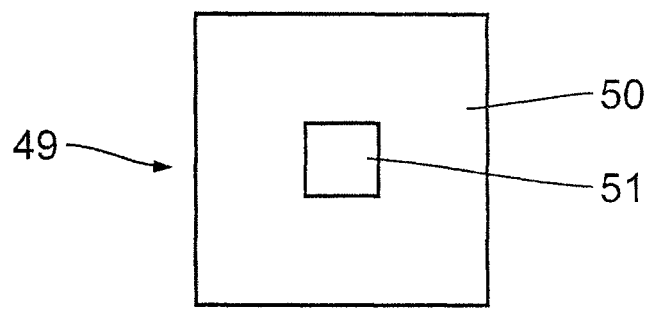
FIGS. 7 to 10 show closed-up embodiment variants of masks which may be used when a local cleaning is performed on the optical surface.
Figure 8:
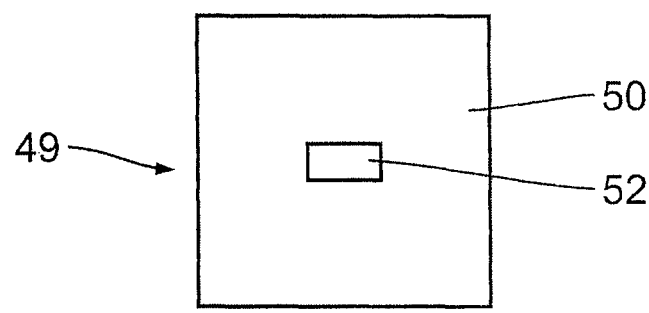
Figure 9:
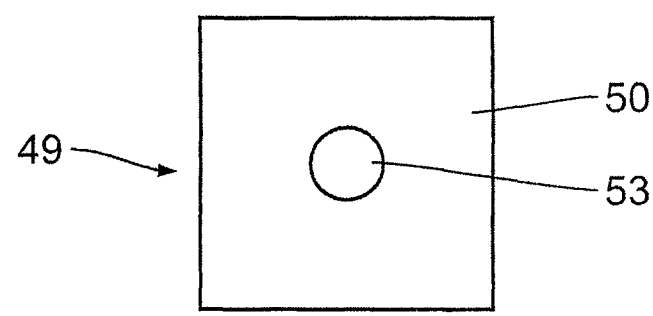
Figure 10:
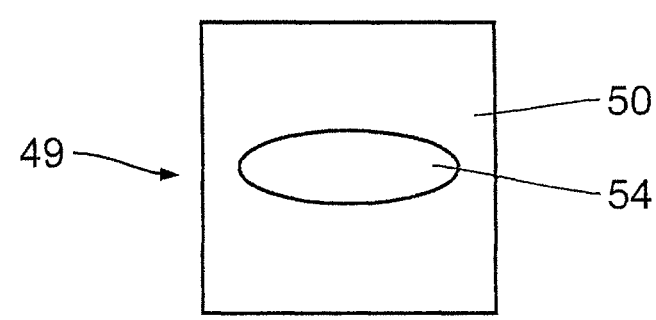

In the embodiment according to FIG. 7 an inner boundary 51 of a breakthrough is square. In the embodiment according to FIG. 8 an inner boundary 52 of the breakthrough is rectangular. In the embodiment according to FIG. 9 an inner boundary 53 of the breakthrough is circular. In the embodiment according to FIG. 10 an inner boundary 54 of the breakthrough is ellipsoidal.

The breakthroughs with inner boundary variants 51 to 54 of masks 49 in accordance with FIGS. 7 to 10 define surface sections on the optical surface 18 to be cleaned selectively. When the selective cleaning of mask 49 having the desired breakthrough shape is performed said mask is brought between cleaning device 23 and optical surface 18 such that the cleaning gas may reach the optical surface 18 only in the region where mask 49 has its breakthrough.

Other variants of pertinent masks 49 having inner boundaries of different shapes, e.g. having polygonal or line-like boundaries, are possible as well. In further embodiments of mask 49 each carrier 50 may also have plural breakthroughs.

Figure 3:
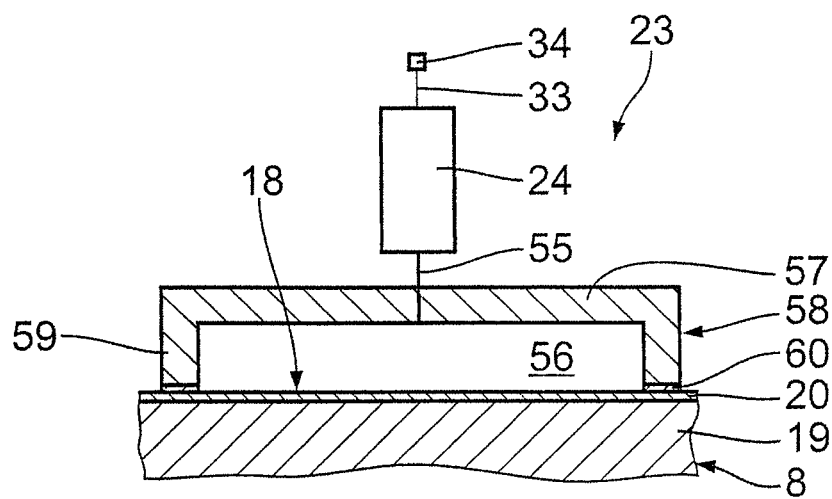
FIG. 3 shows yet another embodiment of a cleaning device in a mirror cut-out in a representation similar to FIG. 2.

FIG. 3 shows an alternative cleaning device 23, based on the example of mirror 8 again. Components corresponding to those which have been explained above already by referring to the first variant of cleaning device 23, have the same numerals and will not be subject to a detailed discussion again.

According to FIG. 3, housing 24 of cleaning device 23 is in fluid communication with an interior space 56 via a gas pipe 55, in which a valve (not shown) is arranged as a locking element. Gas pipe 55 runs through a cover section 57 and is sealed towards the exterior against said section. The end of gas pipe 55 terminates in interior space 56. Interior space 56 is limited by a pot-like delimiting member 58 comprising the cover section 57 and a jacket section 59. The circumferential shape of jacket section 59 is adapted to the shape of optical surface 18 of mirror 8 to be impinged upon by useful beam bundle 3 such that the jacket section 59 completely encloses this used section of optical surface 18. In the case of a section of optical surface 18 having an almost rectangular shape used, cover section 57 is fittingly shaped as a rectangle.

Jacket section 59 has a circumferential sealing gasket 60 on the face side thereof, viz. facing towards optical surface 18. In the operating position of pot-like delimiting member 58 as shown in FIG. 3 the sealing gasket 60 abuts optical surface 18 and thus seals pot-like delimiting member 58 against mirror 8.

The cleaning device 23 according to FIG. 3 enables the optical surface 18 to be cleaned homogenously in two dimensions using the cleaning gas, viz. using atomic hydrogen. For this purpose, pot-like delimiting member 58 is put onto optical surface 18 and thereafter the cleaning gas is fed into internal space 56 via gas pipe 55. Thereupon, optical surface 18 in the interior space and surface layer 38 provided therein, e.g. a carbon layer, are exposed to the cleaning gas for a predetermined time. With the lapse of the exposure time pot-like delimiting member 58 is removed. Together with the particles which have been detached from the reflective coating 20 during the process of cleaning the cleaning gas may be sucked off or removed by flushing with an inert gas.

Within the scope of the methods of manufacture discussed hereinabove cleaning device 23 according to FIG. 3 is used where a homogenous cleaning in two dimensions of optical surface 18 is required. The speed of cleaning is set based on the composition of the cleaning gas in interior space 56. Moreover, the cleaning effect is set based on the term of impingement of the optical surface 18 in interior space 56 with the cleaning gas. A cleaning gas flow is induced in interior space 56 in a targeted manner to produce a dynamical interaction of the cleaning gas with the surface layer 38 on the reflective coating 20.

FIG. 4 shows yet another embodiment of a deposition device 37, which may be employed instead of deposition device 37 according to FIG. 2. Components of deposition device 37 according to FIG. 4, which were explained above already by referring to FIG. 2, have identical numerals and will not be subject to a detailed discussion again.

Deposition device 37 according to FIG. 4 is configured just like deposition device 37 according to FIG. 2 as far as the components accommodated in housing 39 and the driving are concerned. As far as the impingement side towards optical surface 18 is concerned, the deposition device 37 according to FIG. 4 is configured just like the cleaning device 23 according to FIG. 3, with adjustments in relation to the deposition gas employed in conjunction with the deposition device 37 having been made, of course, which deposition gas differs from the cleaning gas.

Deposition device 37 according to FIG. 4 enables a two-dimensional homogenous deposition of surface layer 38 onto optical surface 18. The composition of the deposition gas in interior space 56, the term of impingement of optical surface 18 with the deposition gas and the achievement of a dynamic interaction of the deposition gas with the surface of reflective coating 20 due to the generation of a motion or a flow of the deposition gas in interior space 56 all account for the setting of the thickness of surface layer 38 deposited in this manner.

By means of FIG. 11 a further embodiment of a projection exposure apparatus 61 together with a further embodiment of a cleaning device and a further embodiment of a deposition device is explained below. Components corresponding to those which have been explained above already by referring to FIGS. 1 to 10 have identical numerals and will not be subject to a detailed discussion again.

In the beam path between collector 4 and intermediate focal plane 5a grating 63 is provided on illumination optics 62 which is operated in a grazing incidence mode and serves the purpose of selecting a specific wavelength of useful beam bundle 3.

Figure 11:
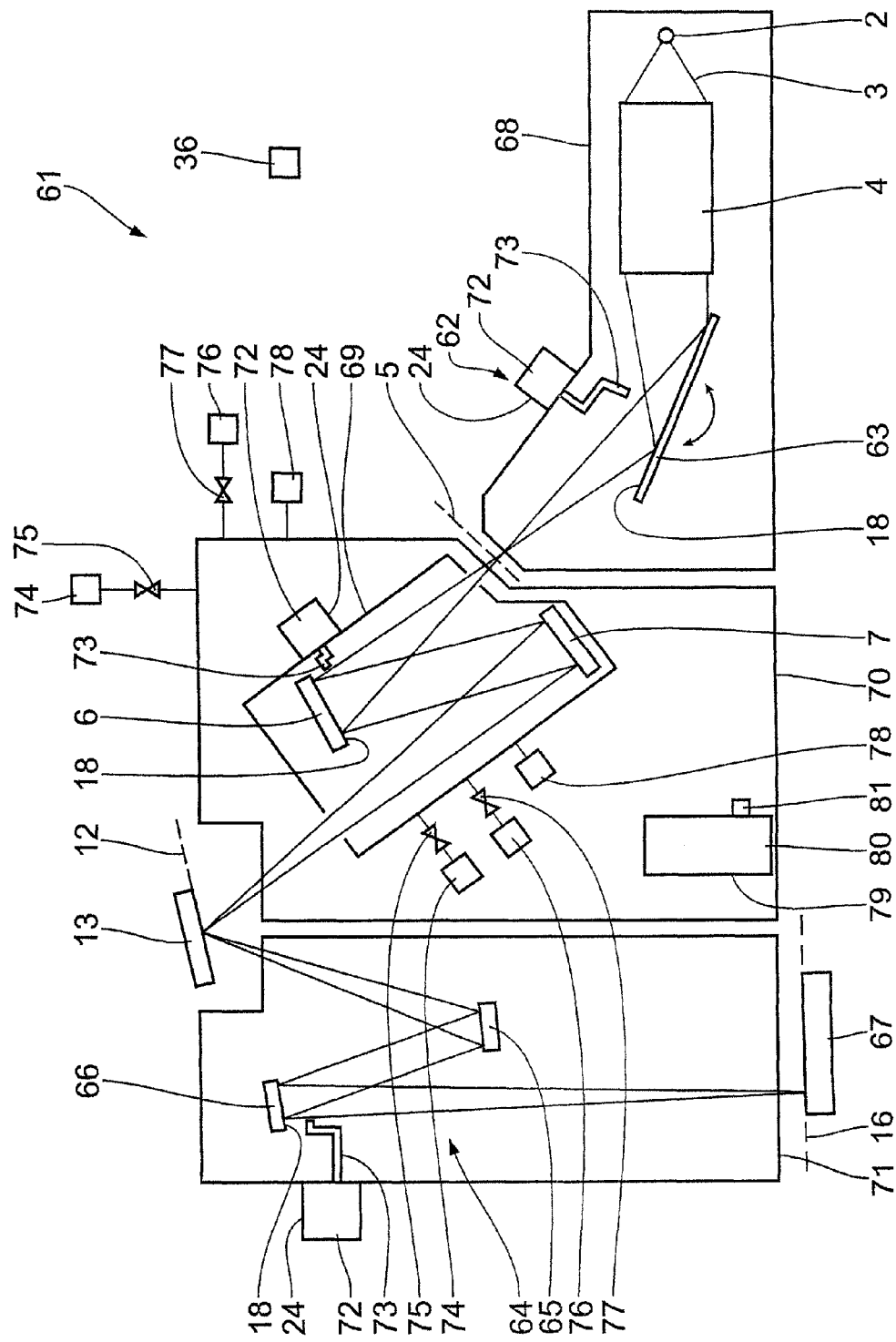
FIG. 11 shows a further embodiment of the exposure projection apparatus having a further embodiment of a cleaning device and a deposition device in a mirrored representation similar to FIG. 1.

In the embodiment of illumination optics 62, reflecting reticle 13, which is arranged in object plane 12, is directly downstream of pupil-facetted mirror 7, i.e., mirrors 8 to 10 in illumination optics 62 according to FIG. 11 are dispensed with in comparison with illumination optics 14.

Projection optics 64 with two mirrors 65, 66 between reticle 13 and image plane 16 is schematically indicated in FIG. 11. Wafer 67 which is impinged upon by useful beam bundle 3, which is arranged in the image plane 16, is also represented in FIG. 11.

Projection exposure apparatus 61 according to FIG. 11 has a modular configuration. A source module 68 contains radiation source 2, collector 4 as well as grating 63. Both facetted mirrors 6 and 7 are contained in a facet module 69. Facet module 69 is surrounded by a further chamber 70. Useful beam bundle 3 is guided through in between source module 68 and chamber 70 adjacent to intermediate focal plane 5 such that the extension of the useful beam bundle 3 perpendicular to the beam direction thereof is low in the region where source module 68, chamber 70 and facet module 69 are guided through the walls.

Projection optics 64 is accommodated in a projection module 71. Modules 68, 69, 71 plus chamber 70 constitute vacuum chambers the interior pressure of which may be predetermined separately from each other.

In the embodiment according to FIG. 11, a cleaning device 72 each is assigned to grating 63, field-facetted mirror 6 and mirror 66 of projection optics 64. Cleaning device 72 of grating 63 is attached on the housing of source module 68. Cleaning device 72 of field-facetted mirror 6 is attached on the housing of facet module 69. Cleaning device 72 of mirror 66 is attached on the housing of projection module 71.

Cleaning devices 72 each have an inlet piece 73 for letting the cleaning gas in, viz., in particular for letting atomic hydrogen in. Thus the function of inlet pieces 73 corresponds to that of nozzle 26 according to the configuration of FIG. 2. Inlet pieces 73 are at least curved once, wherein each of this curvature is 120° at most. In the embodiment according to FIG. 11 each inlet piece 73 is curved twice by about 90°. A direct line of sight between a heating wire to produce atomic hydrogen in the interior of housing 24 of cleaning devices 72 and the optical element to be cleaned each is thus precluded. Due to said curvature of input piece 73 an input of heat from the heating wire towards the optical element to be cleaned may also be reduced.

A flushing of the respectively assigned optical elements with hydrogen via inlet pieces 73 is also possible.

Modules 68, 69, 71 as well as the chamber 70 each have vacuum pumps 74 for pumping out the respective modules or the chamber. This is illustrated in FIG. 11 using facet module 69 and chamber 70 as an example. Via adjustable valves 75, which may be driven from central controller 36 in a manner not shown, the vacuum pumps 74 are in fluid communication with the interior of the respective module or the chamber. Each module 68, 69, 71 and chamber 70 is comprised of a deposition device 76 having a source for a carbon containing deposition gas as explained above in connection with the embodiments of the deposition devices according to FIGS. 1 to 10. The deposition devices 76 for facet module 69 and chamber 70 are shown in FIG. 11 in an exemplary embodiment. Deposition devices 76 are in fluid communication with the interior of the modules or the chamber via adjustable valves 77 which may also be driven by central controller 36.

Each of the modules 68, 69, 71 plus chamber 70 further comprises a pressure sensor or a contamination sensor 78 for detecting a gas pressure or contamination status in the respective module or in the chamber or on the surface of the mirror. FIG. 11 shows examples of pressure sensors or contamination sensors 78 for facet module 69 and chamber 70. The pressure sensors or contamination sensors 78 are in fluid communication with the interior of the assigned module or the chamber. The pressure sensors or contamination sensors 78 are in signal communication with the central controller.

Modules 68, 69, 71 plus chamber 70 are accessible via access openings explained in detail herein below using an access opening 79 of chamber 70 by way of example. The access openings for modules 68, 69 and 71 are configured accordingly.

Access opening 79 is lockable by a door 80. A door signal device 81 is assigned to the respective door 80 and configured to provide a door signal depending on the present position of the door 80. Alternatively or additionally to a door 80a valve (not shown) for closing the module 68, 69, 71 or chamber 70 may be provided as well. Instead of a door signal device, a valve signal device may be provided instead, which is configured to provide a valve signal depending on the present position of the valve.

Cleaning of the optical surfaces 18 using a cleaning device 72 is made in accordance with the explanations provided above in connection with the configurations of cleaning device 23. Prior to the cleaning, module 68, 69, 71 or chamber 70 may be flushed with the carbon containing deposition gas as appropriate via the assigned deposition device 76 by opening adjustable valve 77 such that initially surface layer 38 forms on the optical surface 18 to be cleaned.

This surface layer 38 may be deposited in a targeted manner with the aid of the assigned deposition device 76 upon detection of specific operating conditions of projection exposure apparatus 61. Deposition of surface layer 38 may be made in dependence of the gas pressure value measured with the aid of the pressure sensor or contamination sensor 78 in the assigned module 68, 69, 71 or chamber 70 or on an optical element, in particular a mirror. Deposition gas may be fed into module 68, 69, 71 or chamber 70 via assigned deposition device 76, e.g., upon detection of a tolerance in the pressure value or a tolerance in the contamination value. In this case the risk of the optical surfaces 18 becoming contaminated by foreign particles 46 increases. Due to the rapid feeding of the deposition gas upon detection of a rise in pressure or a rise in contamination, deposition of a surface layer 38, the purpose of which is to ensure that the subsequent cleaning may be accomplished, is made possible, such that foreign particles are not directly adsorbed by the reflective coating 20, however, only indirectly on the optical surface 18 via surface layer 38. If the deposition of surface layer 38 is accomplished the reason why the measured gas pressure value or contamination value has risen may be investigated and a vacuum leakage, if present, may be sealed. Subsequently, the optical surfaces in module 68, 69, 71 or in chamber 70 in which the rise in pressure or the rise in contamination were measured, are cleaned using the assigned cleaning device 72, as explained hereinabove by FIGS. 5 and 6.

Opening of one of the doors 80 or one of the valves 75, 77 constitutes yet another operating condition, depending on the feeding in a targeted manner of deposition gas via deposition device 76.

The process of cleaning is regularly accomplished with the vacuum pumps 74 being operated, which may be used for sucking off gas and/or debris from optical surfaces 18.

The door signalling devices 81 are in signal communication via central controller 36 or directly with adjustable valves 77 of the assigned deposition devices 76. Whenever door signal device 81 detects that the access door 80 is open, adjustable valve 77 of module 68, 69, 71 or chamber 70, to which said door signal device 81 is assigned, instantly opens. This also prevents foreign particles from being adsorbed directly onto reflective coatings 20 which are introduced due to the opening of door 80.

Driving of the adjustable valves 77 via assigned door signal devices 81 in particular may be such that a door signal device 81 of an external chamber, e.g. chamber 70, simultaneously induces an opening of adjustable valves 77 of modules positioned inside, e.g. of facet module 62. In this way deposition of surface layers 38 within an inner module of a chamber, the opening of which was detected, is provided as well which serve the purpose of ensuring that the cleaning is performed subsequently.

A corresponding signal communication or driving may be made via a valve signal device as explained above.

A further operating condition capable of inducing deposition is the exchange of radiation source 2. Once such an exchange is indicated, the adjustable valve of, at least, deposition device 76 assigned to source module 68, is opened automatically. Other servicing or maintenance work as well, requiring module 68, 69, 71 or chamber 70 to be opened may represent an operating condition capable of inducing a deposition.

Figure 12:
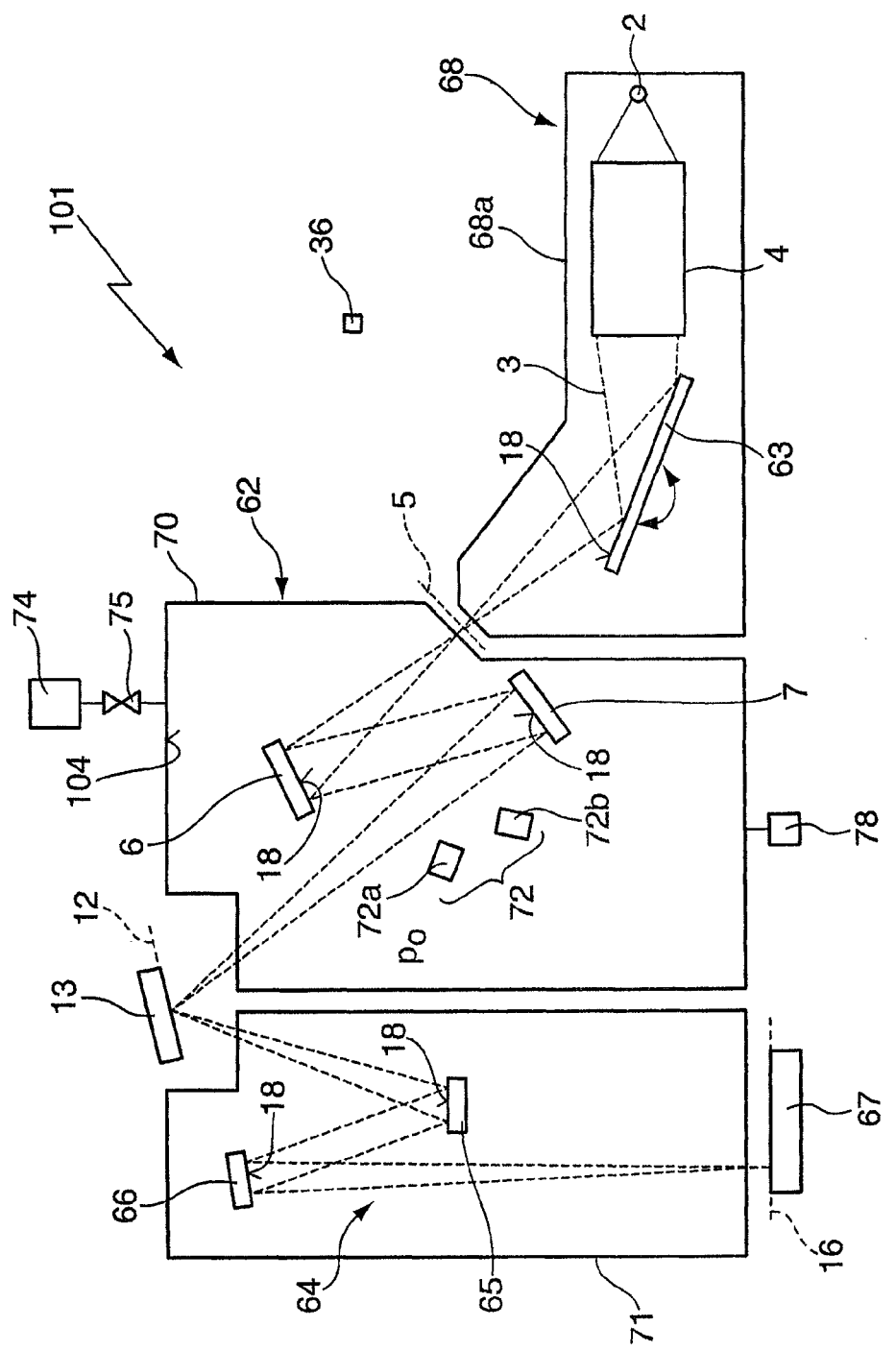
FIG. 12 shows another embodiment of the exposure projection apparatus having a cleaning device adapted to perform particle cleaning at pressures above vacuum pressure.

Another way of performing particle cleaning will be described in the following with respect to FIG. 12, showing another embodiment of a projection exposure apparatus 101. Components corresponding to those which have been explained by referring to FIGS. 1 to 11 have identical numerals and will not be subject to a detailed discussion again.

The exposure apparatus 1, 61, and 101 of FIGS. 1, 11, and 12, respectively, are typically operated at a vacuum pressure $p_o$ of about $10^{-1}$ mbar or below for performing exposure operation. During the exposure operation, at least part of reticle 13 is imaged onto a region of a light-sensitive layer of wafer 67 for the production of a micro- or nano-structured construction element by way of lithography, in particular of a semi-conductor element. Depending on the configuration of projection exposure apparatus 1, 61, or 101 as a scanner or as a stepper, reticle 13 and wafer 67 will be driven time-synchronized in the scanner mode or stepwise in the stepper mode.

In the embodiment shown in FIG. 12, the particle cleaning is performed after the optics integration/maintenance, but before the pump down of the exposure apparatus 101, i.e. before operating the projection exposure apparatus 101 under vacuum conditions. In such a way, it is possible to use non-destructive (physical) particle cleaning methods, i.e. cleaning methods in which particles on the optical surface do not have to undergo a chemical reaction with the cleaning agent, thus reducing the risk of damaging the optical surface during the cleaning.

For the purpose of non-destructive cleaning, the illumination module 62 of the projection exposure apparatus 101 of FIG. 12 comprises a further embodiment of a cleaning device 72, adapted to perform particle cleaning in the vacuum chamber 70 at a pressure $p_c$ above the vacuum pressure $p_o$ used for the exposure operation.

The particle cleaning with the cleaning device 72 may be performed before starting the pump-down of the projection exposure apparatus 101, i.e. at a constant pressure $p_c$, for example at ambient pressure. However, it is also possible to perform the cleaning during the pump-down of the projection exposure apparatus, i.e. when the overall pressure in the vacuum chambers 68a, 70, 71 decreases. In this case, the pressure sensor 78 may be used together with the control device 36 for adapting the parameters of the particle cleaning to the actual pressure conditions in the vacuum chamber 70. Typically, in this case, the pressure $p_c$ during the particle cleaning is always above $10^{-9}$ mbar, preferably above $10^{-3}$ mbar, in particular above 0.1 mbar.

Figure 13:
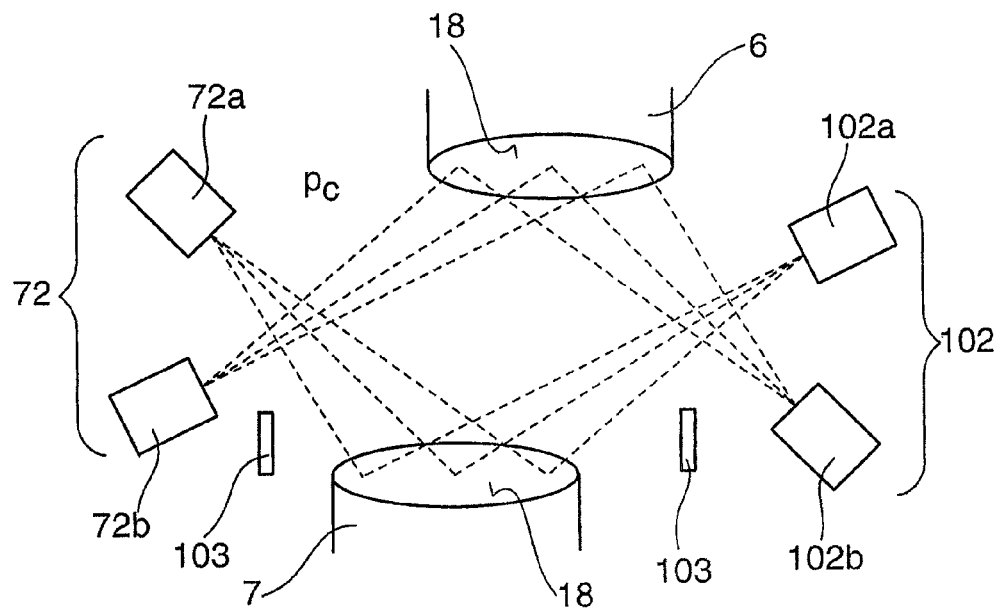
FIG. 13 shows a detailed view of the cleaning device together with a monitoring device for monitoring the particle coverage on the optical surface.

Referring now to FIG. 13, the particle cleaning with, the cleaning device 72 will be described for the example of optical elements 6, 7, it being understood that the cleaning may be performed in an analogous way for any other optical element within the projection exposure apparatus 101. In the embodiment of FIG. 13, the cleaning device 72 comprises a first and second cleaning head 72a, 72b being each directed to an optical surface 18 of the optical elements 6, 7. Furthermore, a monitoring device 102 is arranged close to the optical elements 6, 7, comprising two monitoring heads 102a, 102b, being directed each to an optical surface 18 of the optical elements 6, 7.

In the embodiment shown in FIG. 13, the cleaning heads 72a, 72b are adapted to direct a jet of a cleaning agent to the optical surfaces 18, the cleaning agent being an inert cleaning agent, i.e. an agent which does not react with the particles and the optical surface, respectively. In the present embodiment, the cleaning agent is carbon dioxide, and snow cleaning is performed with the optical elements 6, 7. For this purpose, the cleaning heads 72a, 72b are connected to a source of $CO_2$ gas (not shown) via a valve and the cleaning heads 72a, 72b further comprise a nozzle, e.g. of the Venturi type, having an internal orifice which allows expansion of the $CO_2$ gas to produce a jet of carbon dioxide snow. The snow cleaning may be assisted by an inert gas, such as argon (Ar), or nitrogen ($N_2$), which may be introduced into the vacuum chamber 70 by an additional inlet (not shown). By performing the carbon dioxide cleaning, micron and sub-micron particles as well as hydrocarbon-based contaminants may be removed from the optical surfaces 18 of the optical elements 6, 7.

The person skilled in the art will appreciate that the cleaning device 72 may be modified to perform particle cleaning by other suitable methods. For example, the cleaning device 72 and the cleaning heads 72a, 72b, respectively, may be adapted to produce a jet of air (air knife) with high speed which also allows an effective particle cleaning of the optical surface 18. Also, particle cleaning methods which do not require generation of a jet of cleaning gas may be used, such as laser shockwave cleaning, magnetic field cleaning, high voltage cleaning, plasma assisted cleaning, and temperature assisted cleaning, as described in further detail in US 2008/0218712 A1, or, for the case of a low-pressure environment, in EP 1 329 773 A2. (Both of these references are incorporated into the present application by reference.) For performing these techniques, the cleaning device 72 and the cleaning heads 72a, 72b, respectively, may be suitably modified, e.g. by attaching an electrode to the cleaning head when performing high voltage cleaning, or by using a plasma generator and a laser for the shockwave cleaning. It will be understood that if a plasma light source is used for generating the EUV light, the light source may serve as a plasma generator.

Also, contact cleaning may be performed with the cleaning device 72, e.g. by bringing an adhesive foil into contact with the optical surface for removing the particles. For this purpose, the cleaning device may comprise a contact cleaning unit which may be moved in a linear and/or rotational movement with the aid of a suitable movement mechanism. The contact cleaning unit may e.g. have a swivellable arm, the adhesion foil being attached to one end thereof.

It will be understood that in any case, the cleaning is typically assisted by the monitoring device 102, the latter monitoring the particle coverage on the optical surfaces 18. The monitoring heads 102a, 102b of the present embodiment comprise thermal imaging cameras which allow generating a differential thermal image in order to detect foreign particles on the optical surface 18.

It will be understood that alternatively or in addition, the monitoring may be performed by other monitoring methods, for example light scattering or reflectometry, in which case an additional light source may be arranged within the vacuum chamber 70, which could be attached to the cleaning heads 72a, 72b. Other suitable monitoring methods are holographic methods, typically requiring an interferometer being arranged inside the vacuum chamber 70, as will be described in further detail with respect to FIG. 14 below.

Figure 14:
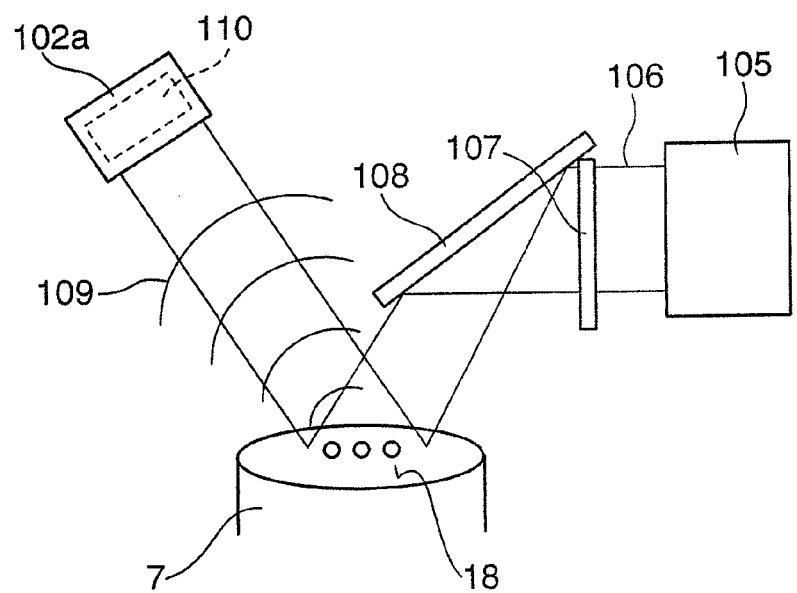
FIG. 14 shows a detailed view of a monitoring device being implemented as a holographic particle fall-out monitor.

In addition to the monitoring head 102a, in the inspection device 102 of FIG. 14, an additional laser light source 105 is provided for generating a laser beam 106, the polarization of which is controlled in a polarizing element 107 before the laser beam 106 is directed to the optical surface 18 of the optical element 7 via a further reflective optical element 108. Each particle or defect on the surface 18 will produce a wave 109 which will be detected by a CCD camera 110 implemented in the monitoring head 102a.

The reconstruction of defects and particles on the surface 18 of the optical element 7 in the monitoring head 102a is performed using a holographic technique: The scattered light waves 109 interfere with the reflected laser beam 106. When these two beams are coherent, optical interference between the reference beam (reflected light) and the object beam (light scattered by particles) produces a series of intensity fringes due to the superposition of the light waves, the intensity fringes being recorded on the standard CCD camera 110 of the monitoring head 102a. In this way, a hologram is created in the CCD camera 110 which can be brought in focus by a computer algorithm which may be implemented on a suitable hardware or software implemented e.g. in the monitoring head 102a. The algorithm uses simple scattering theory, after which, standard recognition software is capable of detecting the particles on the optical surface 18.

In any case, the monitoring device 102 may be used for assisting the cleaning, e.g. by determining the cleaning time and possibly the cleaning method to be used for the particle cleaning. It will be understood that the particle monitoring may also be used for providing feedback about the cleaning. For example, after the finishing of a cleaning step, the result of the particle cleaning, i.e. the remaining particle coverage on the optical surface 18 may be determined using the monitoring device 102. The control device 36 may then decide if subsequent cleaning step(s) are required, and if this is the case, the cleaning time may be determined based on the remaining particle coverage, and a new cleaning cycle may be performed until the particle coverage, i.e. the number of particles per surface area falls below a pre-determined threshold. It will be understood that when a cleaning method is selected which allows particle monitoring also during the cleaning, which typically is the case when electrostatic cleaning (high voltage cleaning) or cleaning using an electro-magnetic field is performed, the monitoring and the cleaning may be performed concurrently, preferably also using a feedback loop.

Both the monitoring heads 102a, 102b and the cleaning heads 72a, 72b may be moved using a movement mechanism which allows to displace and/or tilt the respective heads 102a, 102b, 72a, 72b with respect to the optical surface 18, the movement being controlled by the control unit 36, thus allowing step-wise cleaning/monitoring of different sub-areas of the optical surface 18. The person skilled in the art will appreciate that in this case, both the cleaning and the monitoring may be performed in a scanning manner.

For removing particles which have been cleaned away from the optical surface 18 from the gas atmosphere inside the vacuum chamber 70, there are several possibilities: First, the particles may be pumped away from the vacuum chamber, e.g. by using the vacuum pump 74 which is used for pumping out the vacuum chamber 70, preferably arranging one or more inlet pieces close to the optical elements 6, 7, for removing the particles by suction. It will be understood that alternatively or in addition to the vacuum pump 74, other dedicated pumps may be used for this purpose.

A further possibility for keeping foreign particles away from the optical surfaces 18 is to arrange a particle trapping device 103 inside of the vacuum chamber 70. In the present example, the particle trapping device 103 comprises a cold trap which encompasses the optical surface 18 for "freezing out" particles removed from the optical surface. Alternatively or in addition, the particle trapping device 103 may comprise an electrostatic trap, a magnetic trap, etc. In particular, the walls 104 of the vacuum chamber 70 may be made of a material/coated with a material which adsorbs the particles which have been cleaned away from the optical surface 18, the latter also serving as a particle trapping device. In particular, the adsorbing material may comprise e.g. a catalytic material, preferably rhodium, palladium, molybdenum, iridium, osmium, rhenium, silver, zinc oxide, ruthenium, and their alloys. It will be understood that alternatively or in addition, the adsorbent material may be arranged on the surface of a dedicated particle trap which may be arranged inside of the vacuum chamber 70.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as defined by the appended claims, and equivalents thereof.

The invention claimed is:

1. Optical assembly mounted in a projection exposure apparatus for extreme-ultraviolet lithography, comprising:
   at least one vacuum chamber;
   at least one optical element arranged in said vacuum chamber;
   said optical element having an optical surface arranged to be inpinged upon by a useful beam bundle Of the projection exposure apparatus;
   a pressure sensor configured to detect a gas pressure in said vacuum chamber which accommodates said optical element;
   a cleaning device arranged to clean said optical surface;
   said cleaning device being configured to perform particle cleaning of the optical surface at a gas pressure ($p_c$) within said vacuum chamber which is higher than a vacuum pressure ($p_o$) at which an exposure operation is performed with the projection exposure apparatus; and,
   at least one access opening to the vacuum chamber lockable by a door or by a valve, with a door signal device which is configured to provide door a signal depending on a present position of the door, or with a valve signal device which is configured to provide a valve signal depending on a present position of the valve.

2. The optical assembly accordin to claim 1, wherein during the particle cleaning, the gas pressure ($p_c$) in the vacuum chamber is above $10^{-9}$ mbar.

3. The optical assembly according to claim. 1, further comprising a particle monitoring device configured to monitor a particle coverage on the optical surface.

4. The optical assembly according to claim 3, further comprising a control device configured to control the cleaning performed by the particle cleaning device in accordance with the particle coverage monitored by the particle monitoring device.

5. The optical as assembly according to claim 1, wherein the particle cleaning device comprises at least one cleaning head directed toward the optical surface of the optical element.

6. The optical assembly according to claim 1, wherein the particle cleaning device is configured to perform the particle cleaning by at least one of: snow cleaning, laser shockwave cleaning, air knife cleaning, magnetic field cleaning, high voltage cleaning, plasma assisted cleaning, temperature assisted cleaning, and cleaning with at least one of an adhesion foil and a polymeric peel-off layer.

7. The optical assembly according to claim 3, wherein the particle monitoring device comprises at least one monitoring head directed toward the optical surface of the optical element.

8. The optical assembly according to claim 3, wherein the particle monitoring device is configured to perform the particle monitoring by at least one of: light scattering methods, holographic methods, thermal differential imaging methods, and optical or electron optical methods.

9. The optical assembly according to claim 1, wherein the vacuum chamber further comprises a particle trapping device arranged to trap particles cleaned away from the optical surface.

10. The optical assembly according to claim 1, wherein at least part of the walls of the vacuum chamber are made of a material which adsorbs particles cleaned away front the optical surface.

11. The optical assembly according to claim 1, further comprising a vacuum pump configured to suck off at least one of gases and debris from the optical surface.

12. Optical assembly mounted in a projection exposure apparatus for microlithography, comprising:
   at least one optical element having an optical surface arranged to be impinged upon by a useful beam bundle of the projection exposure apparatus;
   deposition device arranged to deposit a carbon containing layer onto the optical surface;
   a cleaning device arranged to clean the optical surface;
   a vacuum chamber accommodating said optical element;
   a pressure sensor configured to detect a gas pressure in said vacuum chamber; and,
   at least one access opening to the vacuum chamber lockable by door or by a valve, with a door signal device which is configured to provide a door signal depending on a present position of the door with a valve signal device which is configured to provide a valve signal depending on a present position of the valve.

13. The optical assembly according to claim 12, wherein the cleaning device is configured to clean the optical surface with atomic hydrogen.

14. The optical assembly according to claim 12, further comprising a vacuum pump configured to suck off at least one of gases and debris from the optical surface.

15. The optical assembly according to claim 12, wherein the pressure sensor is in signal communication with a controller of the deposition device.

16. A method for cleaning of an optical surface of an optical element arranged in a. vacuum chamber Of a projection exposure apparatus for extreme-ultraviolet lithography, the method comprising the steps of:
   performing particle cleaning of the optical surface at a gas pressure ($p_c$) within the vacuum chamber which is higher than a vacuum pressure ($p_o$) at which an exposure operation is performed with projection exposure apparatus;
   pumping out the vacuum chamber accommodating the optical element during or after cleaning; and,
   depositing a carbon containing layer onto the optical layer of the optical element prior to cleaning the optical element wherein said depositing is performed directing after detecting that a vacuum chamber accommodating the optical element is open, the detecting being based on a door signal depending on a present position of a door for locking the vacuum chamber or being based on a valve signal depending on a present position of a valve for locking the vacuum chamber.

17. The method according to claim 16, further comprising, during the vacuum cleaning, selecting the gas pressure ($p_c$) in the vacuum chamber to be above $10^{-9}$ mbar.

18. The method according to claim 16, wherein the particle cleaning is performed with at least one: particle cleaning method chosen from the group consisting of
   snow cleaning, laser shockwave cleaning, air knife cleaning, magnetic field cleaning, high voltage cleaning, plasma assisted cleaning, temperature assisted cleaning, and cleaning with at least one of an adhesion fell or a polymeric peel-off layer.

19. The method according to claim 16, further comprising monitoring the particle coverage On the optical surface.

20. The method according to claim 19, wherein the particle monitoring is performed by at least one monitoring method selected from the group consisting of: light scattering methods, holographic methods, thermal differential imaging methods, and optical or electron optical methods.

21. The method according to claim 16, further comprising at least one of pumping out and trapping particles cleaned away from the optical surface.

22. Method for cleaning an optical element, comprising:
providing the opitcal element with a carbon containing layer on an optical surface of the optical element;
depositing a carbon containing layer onto the optical layer of the optical element prior to the optical element with said depositing being in accordance with a gas pressure value measured in a vacuum chamber accommodating the optical element;
cleaning the optical element; and,
wherein said depositing is performed directly after detecting that a vacuum chamber accommodating the optical element is open, the detecting being based on a door signal depending on a present position of a door for locking the vacuum chamber or being based on a valve signal depending on a present position of a valve for locking the vacuum chamber.

23. The method according to claim 22, wherein said cleaning comprises cleaning the optical element with atomic hydrogen, nitrogen, oxgen or another reducing or oxidizing compound.

24. The method according to claim 22, further comprising, during or after cleaning,pumping out the vacuum chamber accommodating the optical element.

25. The method according to claim 22, wherein said depositing is prior to an exchange of a radiation source of the projection exposure apparatus.

* * * * *

UNITED STATES PATENT AND TRADEMARK OFFICE
CERTIFICATE OF CORRECTION

PATENT NO. : 8,477,285 B2
APPLICATION NO. : 12/973844
DATED : July 2, 2013
INVENTOR(S) : Dirk Heinrich Ehm et al.

It is certified that error appears in the above-identified patent and that said Letters Patent is hereby corrected as shown below:

IN THE SPECIFICATIONS:

In Column 2:
Line 64: delete "mbr" and substitute -- mbar -- therefor.

In Column 3:
Line 1: delete "he" and substitute -- be -- therefor.

In Column 10:
Line 53: delete "35$a$" and substitute -- 35 a -- therefor.

In Column 13:
Line 41: delete "5$a$" and substitute -- 5 a -- therefor.

In Column 14:
Line 59: delete "80$a$" and substitute -- 80 a -- therefor.

IN THE CLAIMS:

In Column 19:
Claim 1, Line 20: delete "Of" and substitute -- of -- therefor.
Claim 1, Line 33: delete "door a" and substitute -- a door -- therefor.
Claim 2, Line 37: delete "accordin" and substitute -- according -- therefor.
Claim 3, Line 40: delete "claim." and substitute -- claim -- therefor.
Claim 5, Line 48: delete "as".

In Column 20:
Claim 16, Line 41: delete "Of" and substitute -- of -- therefor.
Claim 16, Line 53: delete "directing" and substitute -- directly -- therefor.

Signed and Sealed this
Twenty-fourth Day of December, 2013

Margaret A. Focarino
*Commissioner for Patents of the United States Patent and Trademark Office*

CERTIFICATE OF CORRECTION (continued)
U.S. Pat. No. 8,477,285 B2

Claim 18, Line 64: delete "one:" and substitute -- one -- therefor.
Claim 18, Line 65: delete "of" and substitute -- of: -- therefor.

In Column 21:
Claim 19, Line 5: delete "On" and substitute -- on -- therefor.

In Column 22:
Claim 24, Line 15: delete "cleaning,pumping" and substitute -- cleaning, pumping -- therefor.